United States Patent
Huang et al.

(10) Patent No.: US 7,235,851 B2
(45) Date of Patent: Jun. 26, 2007

(54) SPIN TRANSISTOR AND METHOD THEREOF

(75) Inventors: Ying-Wen Huang, Hsinchu (TW); Chi-Kuen Lo, Hsinchu (TW); Lan-Chin Hsieh, Hsinchu (TW); Yeong-Der Yao, Hsinchu (TW); Der-Ray Huang, Hsinchu (TW); Jau-Jiu Ju, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 232 days.

(21) Appl. No.: 10/942,113

(22) Filed: Sep. 16, 2004

(65) Prior Publication Data

US 2006/0054930 A1 Mar. 16, 2006

(51) Int. Cl.
*H01L 29/82* (2006.01)
*H01L 43/00* (2006.01)

(52) U.S. Cl. .................. 257/421; 257/423; 257/565

(58) Field of Classification Search ............... 257/421, 257/423, 565
See application file for complete search history.

(56) References Cited

U.S. PATENT DOCUMENTS

| | | | |
|---|---|---|---|
| 5,565,695 A | 10/1996 | Johnson | |
| 5,747,859 A | 5/1998 | Mizushima et al. | |
| 5,973,334 A | 10/1999 | Mizushima et al. | |
| 6,178,112 B1 * | 1/2001 | Bessho et al. | 365/173 |
| 6,218,718 B1 | 4/2001 | Gregg et al. | |
| 6,841,259 B1 * | 1/2005 | Takahashi et al. | 428/812 |
| 6,919,608 B2 * | 7/2005 | Gregg | 257/423 |

OTHER PUBLICATIONS

D. J .Monsma et al. (1995), "Perpendicular Hot Electron Spin-Valve Effect in a New Magnetic Field Sensor: The Spin-Valve Transistor", Physical Review Letters, vol. 74, No. 26, pp. 5260-5263.
R. Sato et al.(2001), "Spin-valve transistor with an Fe/Au/Fe(001) base", Applied Physics Letters, vol. 79, No. 8, pp. 1157-1159.
Sebastuaan Van Dijken et al.(2002), "Room temperature operation of a high output current magnetic tunnel transistor", Applied Physics Letters, vol. 80, No. 18, pp. 3364-3366.
O. M. J. van 't Erve et al.(2002), "Transfer ratio of the spin-valve transistor", Applied Physics Letters, vol. 80, No. 20, pp. 3787-3789.
Sebastuaan Van Dijken et al.(2003), "Giant magnetocurrent exceeding 3400% in magnetic tunnel transistors with spin-valve base layers", Applied Physics Letter, vol. 83, No. 5, pp. 951-953.

(Continued)

*Primary Examiner*—Fernando L. Toledo
(74) *Attorney, Agent, or Firm*—Harness, Dickey & Pierce P.L.C.

(57) ABSTRACT

A spin transistor uses a single potential barrier structure to increase a current fluctuation rate. The spin transistor may include at least one of an emitter, a collector, a base and a base resistor. The emitter may be a magneto-resistant device, which may provide an adjustable resistance based on a magnetic field. The collector may be a passive device which may provide the single potential barrier. The base may placed between the emitter and the collector, and may couple the emitter with the collector. The base resistor may be connected to the base in order to provide a bias.

2 Claims, 6 Drawing Sheets

OTHER PUBLICATIONS

Y.W. Huang, et al., "Magnetocurrent in a bipolar spin transistor at room temperature", Applied Physics Letters, Oct. 4, 2004, vol. 85.

C.K. Lo, et al., "Spin Transistor for Magnetic Recording", IEEE Transactions on Magnetics, vol. 41, No. 2, Feb. 2005.

L.C. Hsieh, et al., "Magneto-current study in a silicon base spin valve transistor", Journal of Magnetism and Magnetic Materials, available on line Feb. 28, 2006.

Y.W. Huang, et al., "Spin-valve transistor", Journal of Applied Physics 97, 10D504 (2005).

* cited by examiner

SPIN TRANSISTOR AND METHOD THEREOF

BACKGROUND OF THE INVENTION

1. Field of Invention

The present invention relates generally to transistors and methods thereof, and more particularly to spin transistors and methods thereof.

2. Related Art

Conventional spin transistors may be electronic devices that may use a magnetic field to control an electric current. The effect of spin transistors may be similar to the effect of conventional transistors. An electron may have two spin states: spin up and spin down. The spin states of the electron may be control parameters in conventional transistors.

Conventional spin transistors may have an additional control parameter, namely, a magnetic field. The magnetic field used by a conventional spin transistor may control the electric current by manipulating the spin states of electrons. Thus, electronic devices including conventional spin transistors may have enhanced functionality as compared to electronic devices including only conventional transistors.

Conventional spin transistors may include a bi-potential energy barrier structure (i.e. two potential energy barriers may be combined with a magneto-resistant device in the conventional spin transistor). The bi-potential energy barrier structures may be configured to allow magneto-electric current to pass through the conventional spin transistor.

Other conventional spin transistors may include a first and second n-type ion-doped silicon substrates placed such that each substrate is oriented toward the other. The first and second n-type ion-doped silicon substrates may be vacuum adhered to form an emitter and a collector, respectively. A metallic spin valve (i.e., a base) may be placed between the first and second n-type ion-doped silicon substrates.

The conventional spin transistor may further include two pairs of layers. The first pair of layers may include an emitter (i.e. the first n-type ion-doped silicon substrate) and a base (i.e. the metallic spin valve), the pair of layers formed of platinum (Pt) and Cobalt (Co), respectively. The second pair of layers may include a base to collector (i.e. the second n-type ion-doped silicon substrate), the pair of layers formed of Copper (Cu) and Co, respectively. The above-described first and second pair of layers may form a Schottky barrier diode structure.

When a forward voltage bias is applied to the emitter (i.e. the first n-type ion-doped silicon substrate) and the base (i.e. the metallic spin valve), the hot electrons may exceed a threshold of the energy barrier and may flow through the energy barrier and into the collector. The conduction of the hot electrons may depend on whether the magnetizations of the two Co layers (i.e., the two potential barriers) included in the metallic spin valve have a same direction.

If the external magnetic field is small, the states of the two Co layers may be anti-parallel. In this case, the spin up or spin down electrons may be spin inelastic scattering and the current flow of collector may be relatively small.

If the external magnetic field is large enough to align the magnetizations of the two Co layers in parallel, the probability of spin up electrons flow may increase, thereby increasing the electric current. With conventional spin transistors, a current fluctuation rate of more than 200% of the magneto-electric current may be obtained at ambient temperature. However, the electric current output of conventional spin transistors may be small, thereby limiting their utilization in lower current applications, (e.g., in a range from 1.287 pA to 44 pA). Further, conventional spin transistors may be more difficult to miniaturize.

Another conventional spin transistor may include a magnetic tunnel layer formed as a base adjacent to a collector, the collector being formed by an n-type GaAs substrate. The conventional spin transistor may be a Schottky barrier diode structure. An aluminum layer may be formed on the base and may be oxidized into an aluminum oxide ($Al_2O_3$) layer. An emitter layer may be formed on the aluminum oxide layer, thereby forming another Schottky barrier diode structure. The above-described structure may reduce existing problems in the manufacture of conventional spin transistors, including miniaturization and/or an increased magneto-electric current fluctuation rate. For example, by this method, a current fluctuation rate of more than 3,400% at lower temperature (e.g., 77 Kelvin) may be achieved. However, the GaAs substrate may have a higher cost and/or the aluminum oxide layer may not be formed as a uniform layer. Further, the above-described conventional spin transistor may require a lower electric current input so as to reduce or prevent damage to the aluminum oxide included in the aluminum oxide layer. Accordingly, since only lower electric current input may be used with the above-described conventional spin transistor, the electric current output of the conventional spin transistor may also be lower, thereby limiting their use to lower current applications. Further, the above-described conventional spin transistor may have the additional requirement of operating only at lower temperatures in order to provide an acceptable magneto-electric current fluctuation rate.

Yet another conventional spin transistor may include a magnetic tunnel transistor, which may increase the operating temperature of the bi-potential energy barrier spin transistor. At ambient temperature, the conventional spin transistor may provide up to 1 μA of electric current output and/or the magneto-electric current fluctuation rate may increase up to 64%. In this conventional spin transistor, a cobalt-iron alloy ($Co_{84}Fe_{16}$) layer of 3 nm may be formed as the base on an emitter formed of a n-type GaAs substrate. An aluminum layer oxidized into an aluminum oxide layer may be formed on the cobalt-iron alloy layer (i.e. the base). A ($Co_{84}Fe_{16}$) layer of 5 nm may be formed as the emitter on the aluminum oxide layer. A pinning layer may be coated on the emitter. The pinning layer may include anti-ferromagnetic $Ir_{22}Mn_{78}$. The pinning layer may be capable of pinning the magnetic dipole of the emitter. The pinning layer may be covered with a tantalum (Ta) layer of 5 nm. The magnetic dipole of the base may be modified without affecting the magnetic dipole of the emitter. Thus, the spin direction of the injection electron may be controlled.

However, the above-described conventional spin transistor may include a GaAs substrate. The GaAs substrate may be expensive. Further, the aluminum oxide layer may not be formed as a uniform layer. Since the magneto-resistant device with a higher current fluctuation rate may require a higher-quality (i.e. uniform) layer, the complexity of the manufacturing process may increase as a more uniform aluminum oxide layer may be difficult to produce.

SUMMARY OF THE INVENTION

An example embodiment of the present invention is a spin transistor, including an emitter with a first resistance, a collector for providing a potential barrier, the collector being the only potential barrier of the spin transistor, and a base for coupling the emitter and the collector.

Another example embodiment of the present invention is a spin transistor, including a collector for providing a potential barrier, the collector being the only potential barrier of the spin transistor, and an emitter and a base forming a first magneto resistant device, the emitter and the base having an adjustable resistance, the adjustable resistance based on a magnetic field, the base interposed between the emitter and the collector to couple the emitter and the collector.

Another example embodiment of the present invention is a method of forming a spin transistor, including forming a collector as a potential barrier, the collector being the only potential barrier of the spin transistor.

Another example embodiment of the present invention is a spin transistor, including a collector for providing a potential barrier, the collector being the only potential barrier of the spin transistor.

BRIEF DESCRIPTION OF THE DRAWINGS

The present invention will become more apparent by describing in detail the example embodiments thereof with reference to the attached drawings in which.

DETAILED DESCRIPTION OF EXAMPLE EMBODIMENTS OF THE INVENTION

Figure 1:
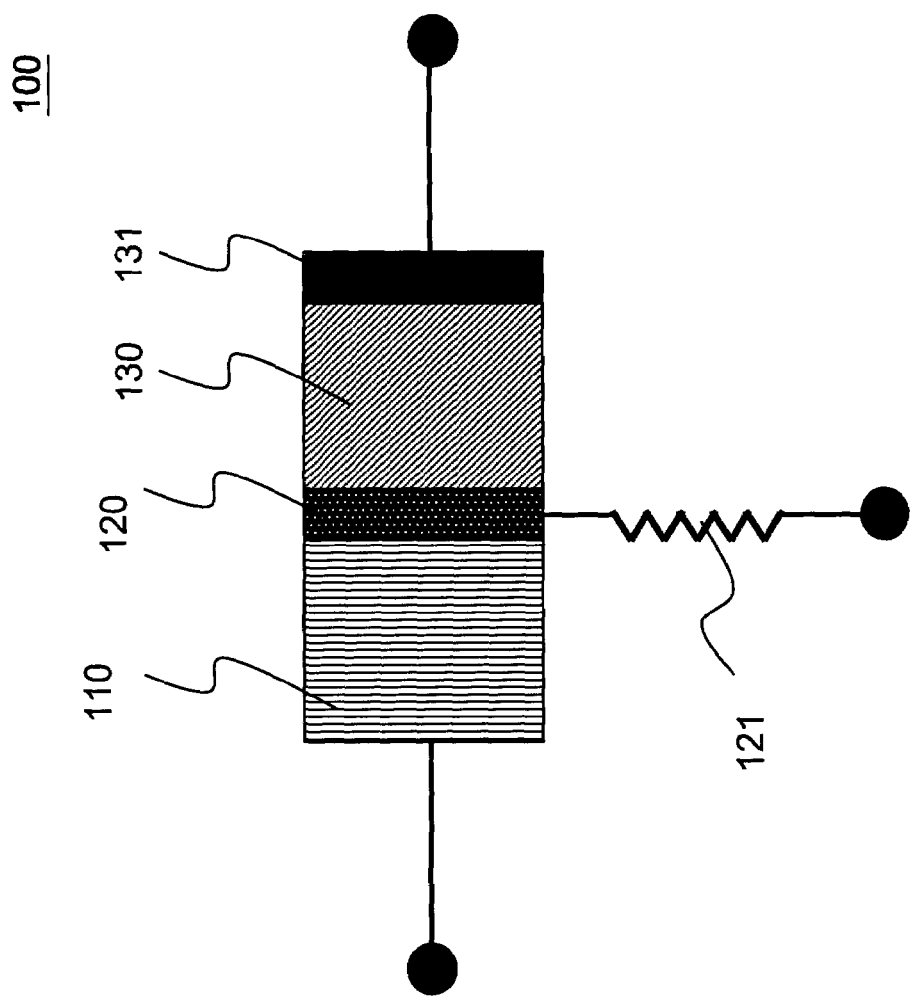
FIG. 1 illustrates a schematic view of a spin transistor 100 according to an example embodiment of the present invention.

FIG. 1 illustrates a schematic view of a spin transistor 100 according to an example embodiment of the present invention.

In an example embodiment of the present invention, the spin transistor 100 may include an emitter 110, a base 120, a base resistor 121, a collector 130 and/or an ohmic contact layer 131.

In another example embodiment of the present invention, the emitter 110 may include a magneto-resistance device.

In another example embodiment of the present invention, the emitter 110 may include a magneto-resistant device formed by at least one magnetic film. The at least one magnetic film may provide a corresponding at least one resistance. The at least one resistance may be based on the properties of an external magnetic field.

In another example embodiment, the collector 130 may be a passive element.

In another example embodiment of the present invention, the passive element (i.e., the collector 130) may be any type of diode and/or resistor.

In another example embodiment of the present invention, the diode may be a p-n junction diode, a p-i-n diode, a Schottky-barrier diode, a planar-doped-barrier diode, a tunnel diode, resonant-tunneling diode, a resonant-interband-tunneling diode, a single-barrier tunnel diode, a single-barrier interband-tunneling diode, a real-space-transfer diode, a heterostructure hot-electron diode, an impact-ionization-avalanche transit-time diode, a barrier-injection transit-time diode, a p-i-n photodiode, a Schottky-barrier photodiode and/or an avalanche photodiode.

In another example embodiment of the present invention, the collector 130 may include a p-n diode. The p-n diode may include p-n junctions, thereby providing a single potential barrier.

In another example embodiment of the present invention, the collector 130 may be coated with the ohmic contact layer 131.

In another example embodiment of the present invention, the ohmic contact layer 131 may include gold.

In another example embodiment of the present invention, the base 120 may be formed between the emitter 110 and the collector 130, thereby coupling the emitter 110 and the collector 130.

In another example embodiment of the present invention, the base resistor 121 may be connected to the base 120.

In another example embodiment of the present invention, the magneto-resistant device may be a tunneling magneto-resistant device, a spin valve element, and/or a giant magneto-resistant element.

In another example embodiment of the present invention, a current fluctuation rate for the collector 130 of the spin transistor 100 may be measured.

Figure 2:
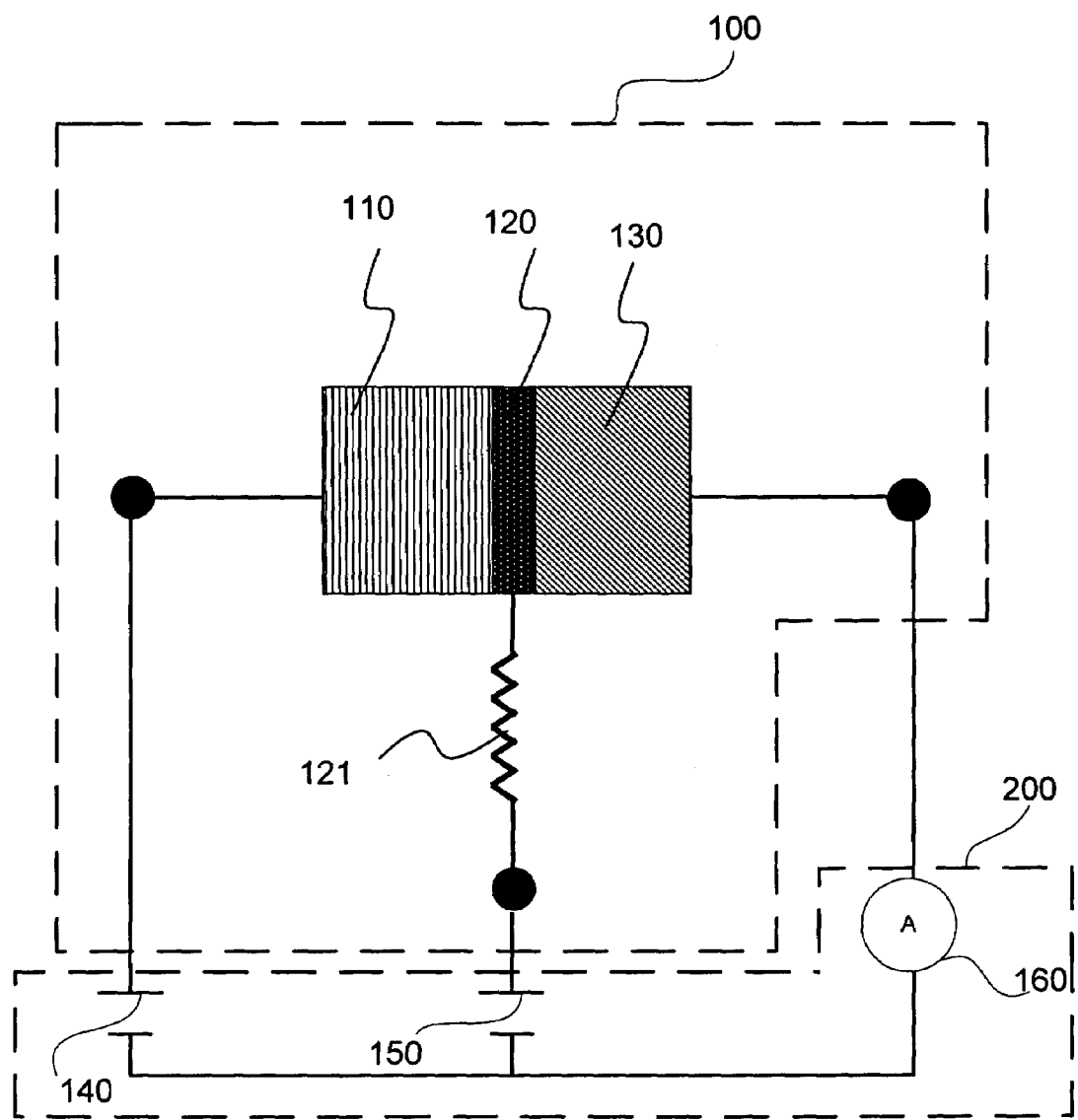
FIG. 2 illustrates the spin transistor 100 of FIG. 1 including a measurement device 200 according to an example embodiment of the present invention.

FIG. 2 illustrates the spin transistor 100 of FIG. 1 including a measurement device 200 according to an example embodiment of the present invention.

In another example embodiment of the present invention, referring to FIG. 2, the measurement device 200 may include an ampere meter 160 configured to measure the electric current output from the collector 130. The measurement device 200 may further include one or more voltage sources 140 and 150 configured to apply voltages, for example, to the emitter 110 and the base 120, respectively. Voltage sources and ampere meters are well-known in the art and will not be described further for the sake of brevity.

In another example embodiment of the present invention, voltages ($V_E$) 140 and ($V_B$) 150 from the voltage sources 140 and 150 may be applied to the emitter 110 and the base 120, respectively. An inputted emitter current may be based on an emitter-to-base voltage $V_{EB}$ divided by the resistance of the magneto-resistant device. Thus, the resistance of the magneto-resistant device may vary based on the application of different magnetic fields. The resistance of the magneto-resistant device may be controlled by the strength of the magnetic field in order to produce different input currents and corresponding output currents.

In another example embodiment of the present invention, including the single potential barrier of the spin transistor may simplify the structure of the spin transistor.

In another example embodiment of the present invention, a process of forming elements of the spin transistor may be included in a semiconductor process.

In another example embodiment of the present invention, the emitter 110, the base 120 and the collector 130 may each be formed on a semiconductor substrate, a glass substrate or a plastic substrate.

In another example embodiment of the present invention, the semiconductor substrate may include a silicon-based substrate and/or a GaAs substrate. This structure may increase the input current, which may subsequently increase the output current, thereby increasing the current fluctuation rate of the collector 130.

In another example embodiment of the present invention, a tunneling magneto-resistant device may be included for the current fluctuation rate measurement at room temperature.

In another example embodiment of the present invention, the tunneling magneto-resistant device may include a laminate structure which may include a first ferromagnetic layer, an insulation layer and/or a second ferromagnetic layer.

In another example embodiment of the present invention, the base 120 may include the first ferromagnetic layer.

Figure 3:
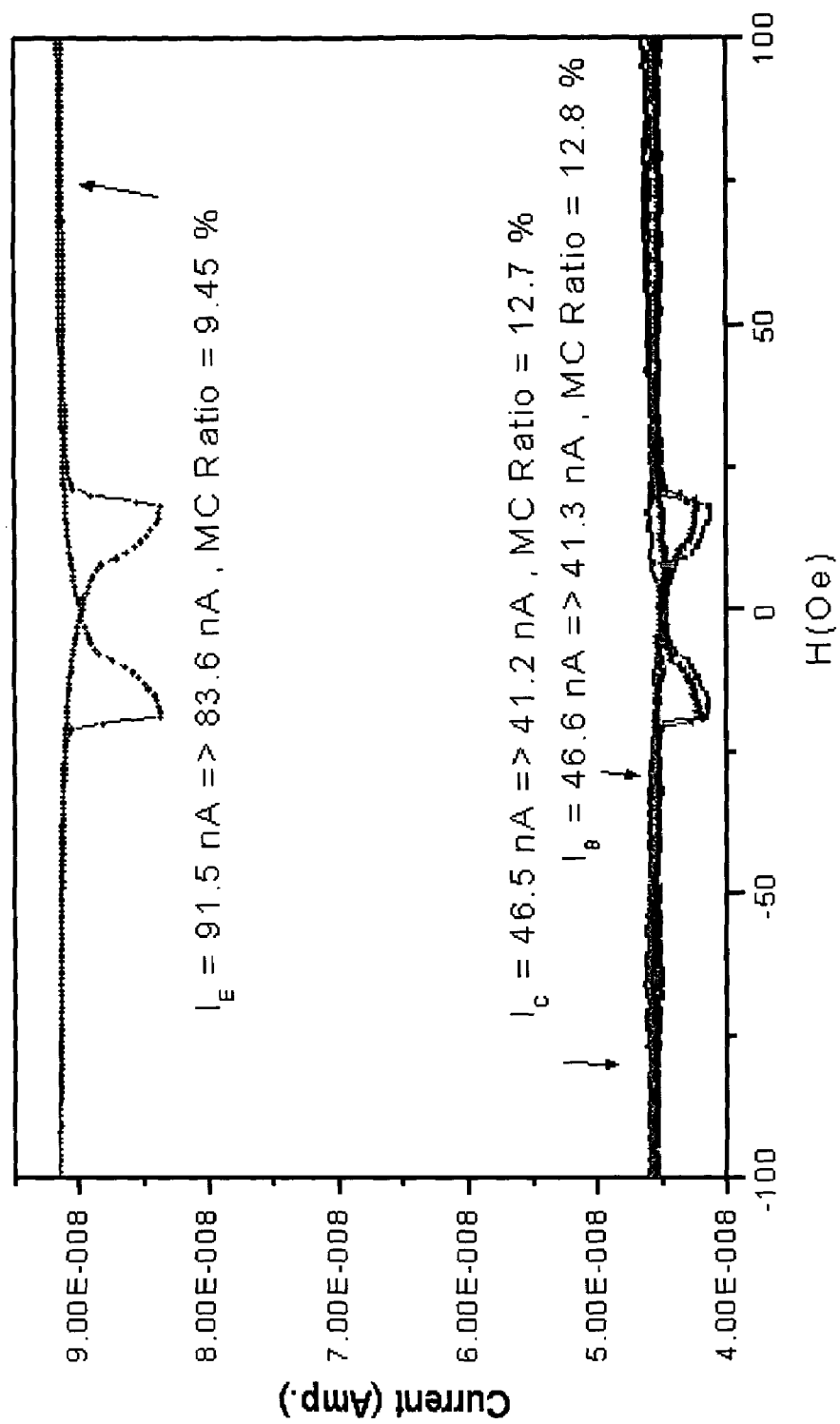
FIG. 3 is a graph of current fluctuation rate measurement results obtained by the measurement device 200 of FIG. 2 according to an example embodiment of the present invention.

FIG. 3 is a graph of current fluctuation rate measurement results obtained by the measurement device 200 of FIG. 2 according to an example embodiment of the present invention.

In an example of an embodiment of the present invention, referring to FIG. 3, the base resistance, the emitter voltage and the base voltage may be 2000Ω, 600 mV and 0V, respectively. The current fluctuation rates may be obtained from the graph of FIG. 3. The emitter current $I_E$ may decrease from 91.5 nA to 83.6 nA and the current fluctuation rate for the emitter 110 may increase 9.45%; the base current $I_B$ may decrease from 46.6 nA to 41.3 nA, and the current fluctuation rate for the base 120 may increase 12.8%; the collector current $I_C$ may decrease from 46.5 nA to 41.2 nA, and the current fluctuation rate for the collector 130 may increase 12.7%.

Figure 4:
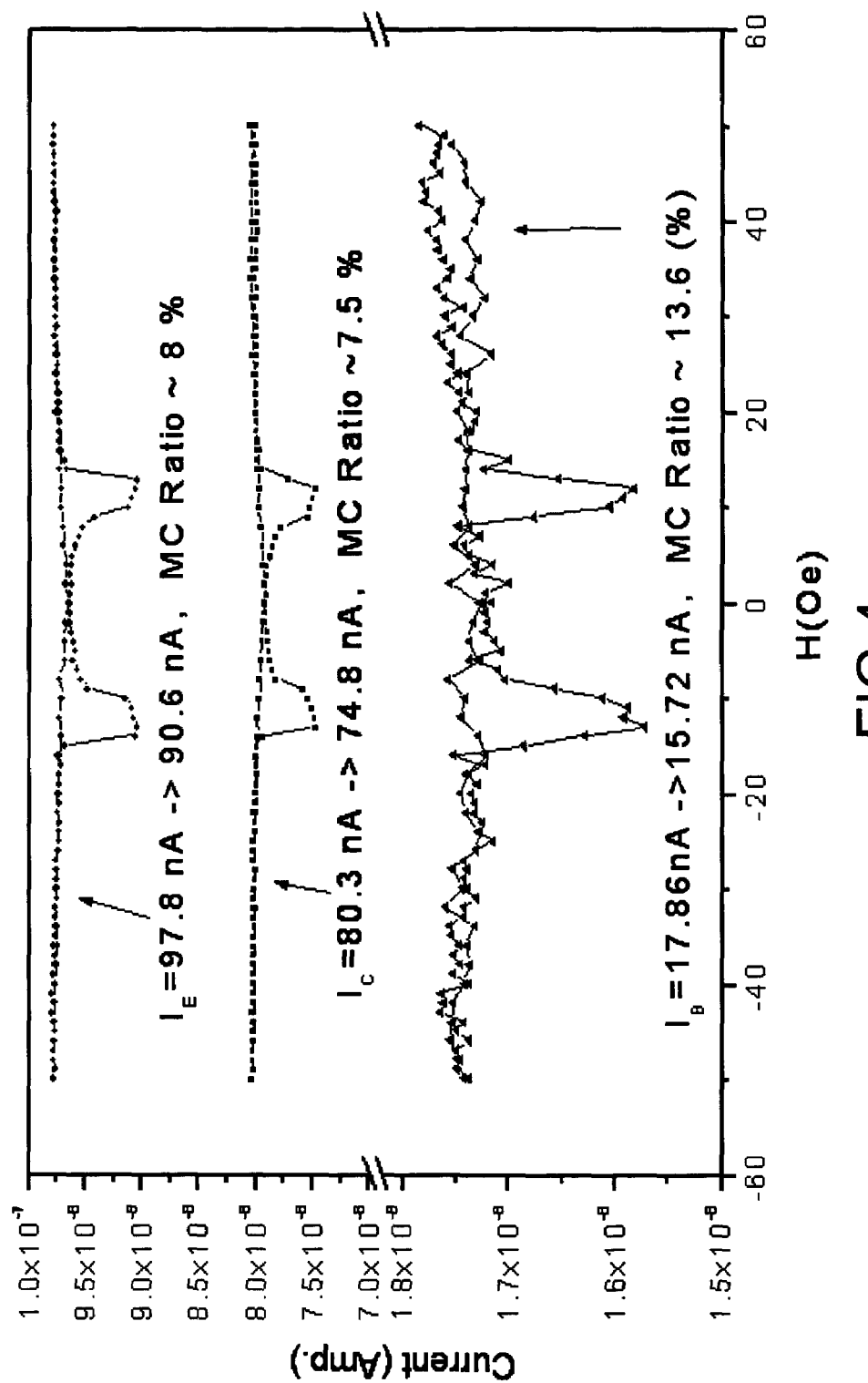
FIG. 4 is a another graph of current fluctuation rate measurement results obtained by the measurement device 200 of FIG. 2 according to an example embodiment of the present invention.

FIG. 4 is another graph of current fluctuation rate measurement results obtained by the measurement device 200 of FIG. 2 according to an example embodiment of the present invention.

In another example of an embodiment of the present invention, referring to FIG. 4, the base resistor may have a resistance of 100,000Ω, the emitter voltage may be 65 mV and the base voltage may be 0V. The current fluctuation rates may be obtained from the graph of FIG. 4. The emitter current $I_E$ may decrease from 97.8 nA to 90.6 nA, and the fluctuation rate for the emitter 110 may increase 8%. The base current $I_b$ may decrease from 17.86 nA to 15.72 nA, and the current fluctuation rate for the base 120 may increase 13.6%. The collector current $I_C$ may decrease from 80.3 nA to 74.8 nA, and the current fluctuation rate for the collector 130 may decrease 7.5%. Thus, as compared to the measurement results observed in FIG. 3, the ferromagnetic current fluctuation rate observed in the graph of FIG. 4 may be adjusted by changing the base resistance, the emitter voltage and/or the base voltage.

Figure 5:
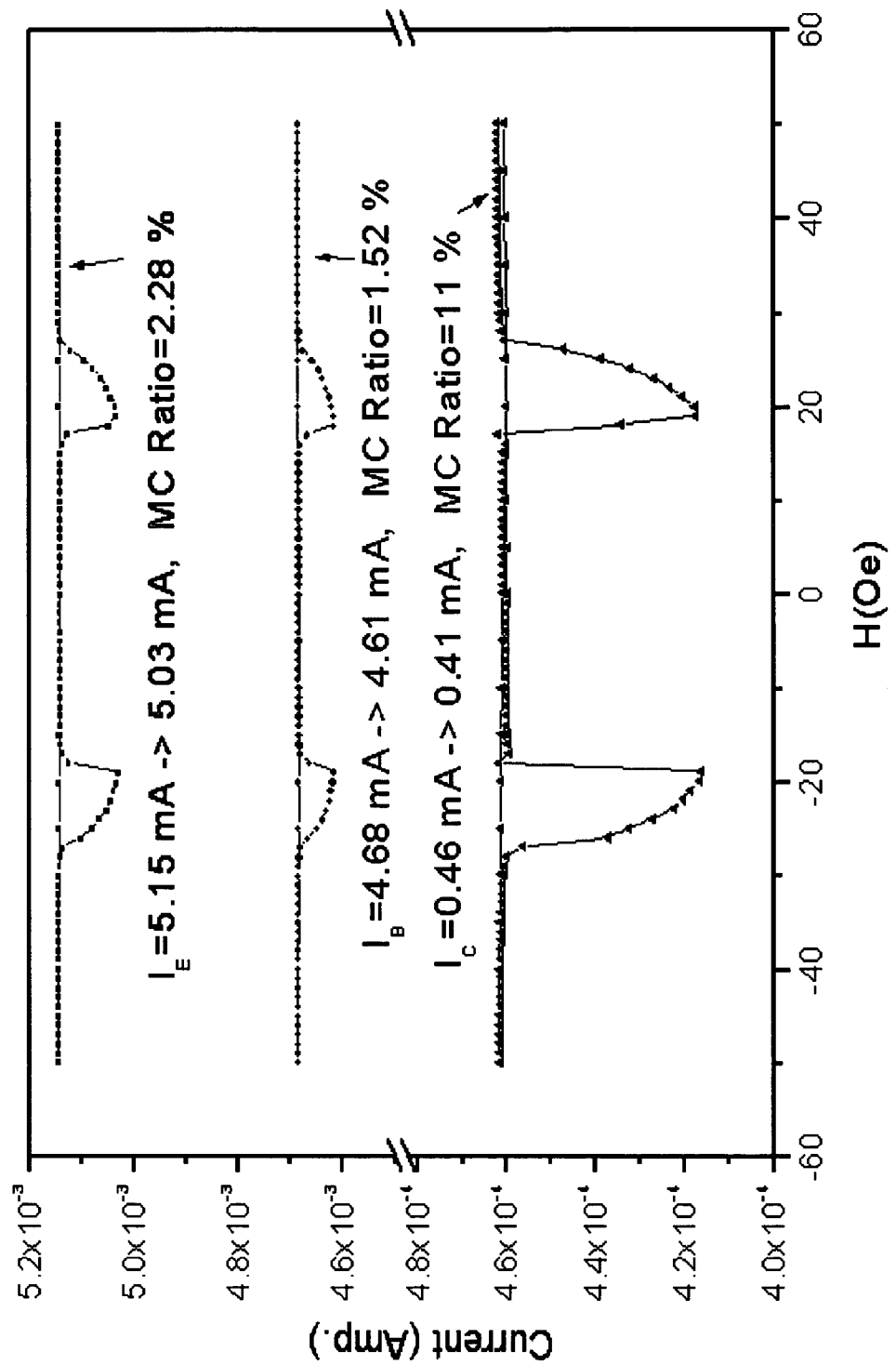
FIG. 5 is another graph of current fluctuation rate measurement results obtained by the measurement device 200 of FIG. 2 according to an example embodiment of the present invention.

FIG. 5 is another graph of current fluctuation rate measurement results obtained by the measurement device 200 of FIG. 2 according to an example embodiment of the present invention.

In another example embodiment of the present invention, referring to FIG. 5, a spin magneto-resistant device may be used for a current fluctuation rate measurement at room temperature. The base 120 may be placed between the spin magneto-resistant device and the passive device.

In an example of another embodiment of the present invention, referring to FIG. 5, the base resistance, the emitter voltage and the base voltage may be 100Ω, 1.26 V and 0V, respectively. The current fluctuation rates may be obtained from the graph of FIG. 5. The emitter current $I_E$ may decrease from 5.15 mA to 5.03 mA, and the current fluctuation rate for the emitter 110 may increase 2.28%. The base current $I_B$ may decrease from 4.68 mA to 4.61 mA, and the current fluctuation rate for the base 120 may increase 1.52%. The collector current $I_C$ may decrease from 0.46 mA to 0.41 mA, and the current fluctuation rate for the collector 130 may increase 11%.

Figure 6:
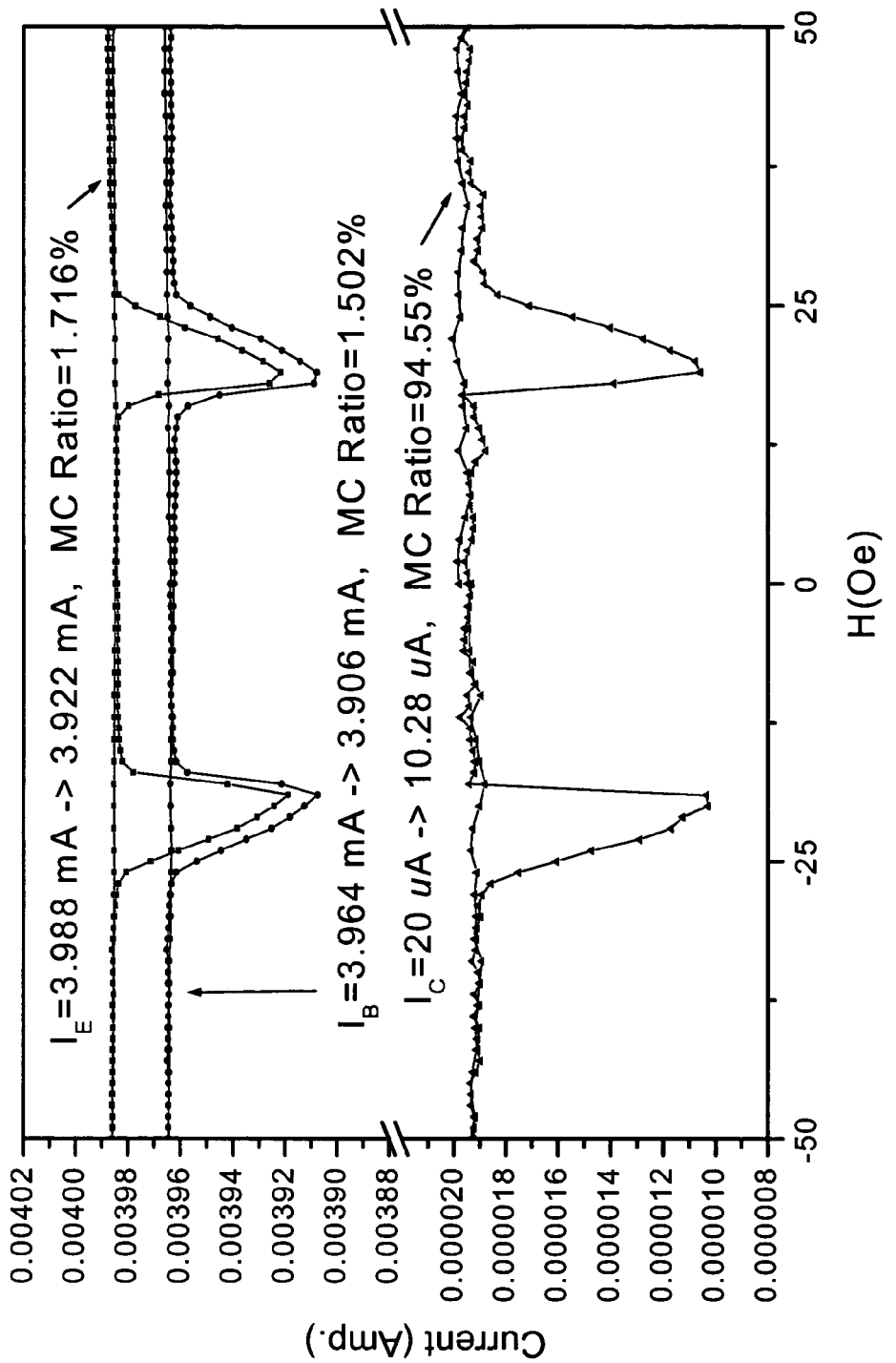
FIG. 6 is another graph of current fluctuation rate measurement results obtained by the measurement device 200 of FIG. 2 according to an example embodiment of the present invention.

FIG. 6 is another graph of current fluctuation rate measurement results obtained by the measurement device 200 of FIG. 2 according to an example embodiment of the present invention.

In another example of an embodiment of the invention, referring to FIG. 6, the emitter voltage may be adjusted to 1V. The base resistance and the base voltage may be maintained at 100Ω and 0V, respectively. The current fluctuation rates may be obtained from the graph of FIG. 6. The emitter current $I_E$ may decrease from 3.988 mA to 3.922 mA, and the current fluctuation rate for the emitter 110 may increase 1.716%. The base current $I_B$ may decrease from 3.964 mA to 3.906 mA, and the current fluctuation rate for the base 120 may increase 1.502%. The collector current $I_C$ may decrease from 20 µA to 10.28 µA, and the current fluctuation rate for the collector 130 may increase 94.55%.

In another example embodiment of the present invention, a spin transistor may be employed at room temperature with an increased output current and an increased current fluctuation rate due to a use of a single potential barrier. The output current, the current fluctuation rate and the current gain may be adjusted by changing at least one of the emitter voltage, the base voltage and/or the base resistance. Thus, the spin transistor, according to example embodiments of the present invention, may be used in applications including various requirements with respect to the output current, the current fluctuation rate and/or the current gain.

The example embodiments of the present invention being thus described, it will be obvious that the same may be varied in many ways. For example, FIGS. 3-6 illustrate graphs of measured current characteristics of various example spin transistors. However, it is understood that while these are specific examples, and that any input currents, voltages and/or resistances may be used to accommodate various example spin transistors.

Such variations are not to be regarded as departure from the spirit and scope of the example embodiments of the present invention, and all such modifications as would be obvious to one skilled in the art are intended to be included within the scope of the following claims.

What is claimed is:

1. A spin transistor, comprising:
    an emitter with a first resistance;
    a collector for providing a potential barrier, the collector being the only potential barrier of the spin transistor, wherein the collector includes at least one of a diode and a resistor, the diode includes at least one of a p-n junction diode, p-i-n diode, a Schottky-barrier diode, a planar-doped-barrier diode, a tunnel diode, a resonant-tunneling diode, a resonant-interband-tunneling diode, a single-barrier tunnel diode, a single-barrier an inter-band-tunneling diode, a real-space-transfer diode, a heterostructure hot-electron diode, a impact-ionization-avalanche transit-time diode, a barrier-injection transit-time diode, a p-i-n photodiode, a Schottky-barrier photodiode and an avalanche photodiode; and
    a base for coupling the emitter and the collector.

2. A spin transistor, comprising:

a collector for providing an electrically controllable potential barrier, the collector being the only electrically controllable potential barrier of the spin transistor, wherein the collector includes at least one of a diode and a resistor, the diode includes at least one of a p-n junction diode, a p-i-n diode, a Schottky-barrier diode, a planar-doped-barrier diode, a tunnel diode, a resonant-tunneling diode, a resonant-interband-tunneling diode, a single-barrier tunnel diode, a single-barrier interband-tunneling diode, a real-space-transfer diode, heterostructure hot-electron diode, an impact-ionization-avalanche transit-time diode, a barrier-injection transit-time diode, a p-i-n photodiode, a Schottky-barrier photodiode and an avalanche photodiode; and an emitter and a base forming a first magneto resistant device, the emitter and the base having a first adjustable resistance, the first adjustable resistance based on a magnetic field, the base interposed between the emitter and the collector to couple the emitter and the collector.

* * * * *